(12) United States Patent
Zhang et al.

(10) Patent No.: US 9,330,911 B2
(45) Date of Patent: May 3, 2016

(54) LIGHT EMITTING DEVICE HAVING GROUP III-NITRIDE CURRENT SPREADING LAYER DOPED WITH TRANSITION METAL OR COMPRISING TRANSITION METAL NITRIDE

(75) Inventors: Jianping Zhang, El Monte, CA (US); Chunhui Yan, El Monte, CA (US)

(73) Assignee: INVENLUX LIMITED, Central (HK)

( * ) Notice: Subject to any disclaimer, the term of this patent is extended or adjusted under 35 U.S.C. 154(b) by 220 days.

(21) Appl. No.: 13/215,122

(22) Filed: Aug. 22, 2011

(65) Prior Publication Data

US 2013/0048939 A1 Feb. 28, 2013

(51) Int. Cl.
| | |
|---|---|
| *H01L 33/06* | (2010.01) |
| *H01L 21/02* | (2006.01) |
| *H01L 33/14* | (2010.01) |
| *H01L 33/10* | (2010.01) |
| *H01L 33/32* | (2010.01) |

(52) U.S. Cl.
CPC ........ *H01L 21/0262* (2013.01); *H01L 21/0242* (2013.01); *H01L 21/0254* (2013.01); *H01L 21/02439* (2013.01); *H01L 21/02458* (2013.01); *H01L 21/02507* (2013.01); *H01L 21/02581* (2013.01); *H01L 33/14* (2013.01); *H01L 33/10* (2013.01); *H01L 33/32* (2013.01)

(58) Field of Classification Search
CPC ..................... H01L 21/0242; H01L 21/02439; H01L 21/02458; H01L 21/02507; H01L 21/0254; H01L 21/02581; H01L 21/0262; H01L 33/10; H01L 33/14; H01L 33/32
USPC ................ 257/13, E21.09, E33.028; 438/478
See application file for complete search history.

(56) References Cited

U.S. PATENT DOCUMENTS

| | | | |
|---|---|---|---|
| 5,226,053 A | 7/1993 | Cho et al. | |
| 6,548,405 B2 * | 4/2003 | Kraus et al. | .................... 438/688 |
| 6,630,692 B2 | 10/2003 | Goetz et al. | |
| 7,026,653 B2 | 4/2006 | Sun | |
| 7,511,411 B2 * | 3/2009 | Maruta et al. | .................. 313/483 |
| 7,964,478 B2 * | 6/2011 | Choi et al. | ...................... 438/478 |
| 8,183,557 B2 * | 5/2012 | Iza et al. | ........................... 257/22 |
| 8,344,409 B2 * | 1/2013 | Peng et al. | ....................... 257/98 |
| 8,829,546 B2 * | 9/2014 | Denbaars et al. | ................ 257/98 |
| 2004/0129200 A1 * | 7/2004 | Kouvetakis et al. | ............... 117/2 |
| 2005/0030999 A1 * | 2/2005 | Yoneda | ............................ 372/46 |
| 2006/0275937 A1 * | 12/2006 | Aoyagi et al. | ................... 438/22 |
| 2008/0142810 A1 * | 6/2008 | Tompa et al. | .................... 257/76 |
| 2008/0257409 A1 * | 10/2008 | Li et al. | ........................... 136/259 |
| 2008/0259980 A1 * | 10/2008 | Wierer et al. | .............. 372/44.01 |
| 2010/0044718 A1 * | 2/2010 | Hanser et al. | .................... 257/76 |
| 2011/0001420 A1 * | 1/2011 | Tchakarov et al. | ............ 313/355 |

(Continued)

OTHER PUBLICATIONS

Yukio Narukawa et al, "White light emitting diodes with super-high luminous efficacy" Journal of Physics D: Applied Physics, vol. 43, (2010), 354002, pp. 1-6.

*Primary Examiner* — Stephen W Smoot
*Assistant Examiner* — Edward Chin
(74) *Attorney, Agent, or Firm* — J.C. Patents

(57) ABSTRACT

A light-emitting device, such as a light-emitting diode (LED), has a group III-nitride current spreading layer which is either doped with transition metal, or comprises alternating transition metal nitride layer and group III-nitride layer. Also provided is a light-emitting device, such as a light-emitting diode (LED), having a quantum well doped with transition metal. Also provided is a method of forming transition-metal containing AlInGaN electrical conductive material.

21 Claims, 9 Drawing Sheets

(56) References Cited

U.S. PATENT DOCUMENTS

| | | |
|---|---|---|
| 2011/0140077 A1* | 6/2011 | Song .............................. 257/13 |
| 2011/0212559 A1* | 9/2011 | Ohmae et al. .................. 438/46 |
| 2011/0298062 A1* | 12/2011 | Ganguli et al. ............... 257/410 |
| 2012/0238047 A1* | 9/2012 | Bawendi et al. ............... 438/46 |
| 2012/0286239 A1* | 11/2012 | Won et al. ...................... 257/13 |
| 2012/0313124 A1* | 12/2012 | Clatterbuck et al. ........... 257/98 |
| 2012/0322185 A1* | 12/2012 | Yao et al. ........................ 438/29 |
| 2013/0034947 A1* | 2/2013 | Hong et al. .................... 438/384 |
| 2013/0048939 A1* | 2/2013 | Zhang et al. .................... 257/13 |

* cited by examiner

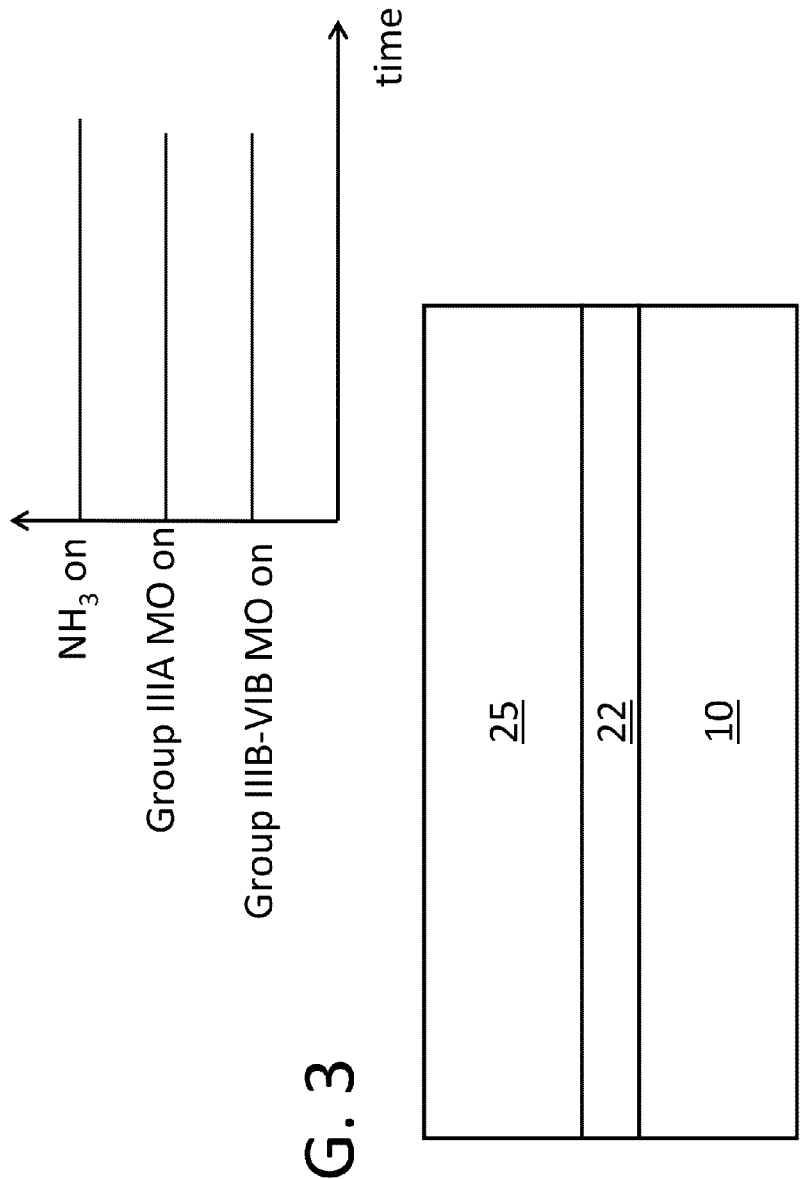

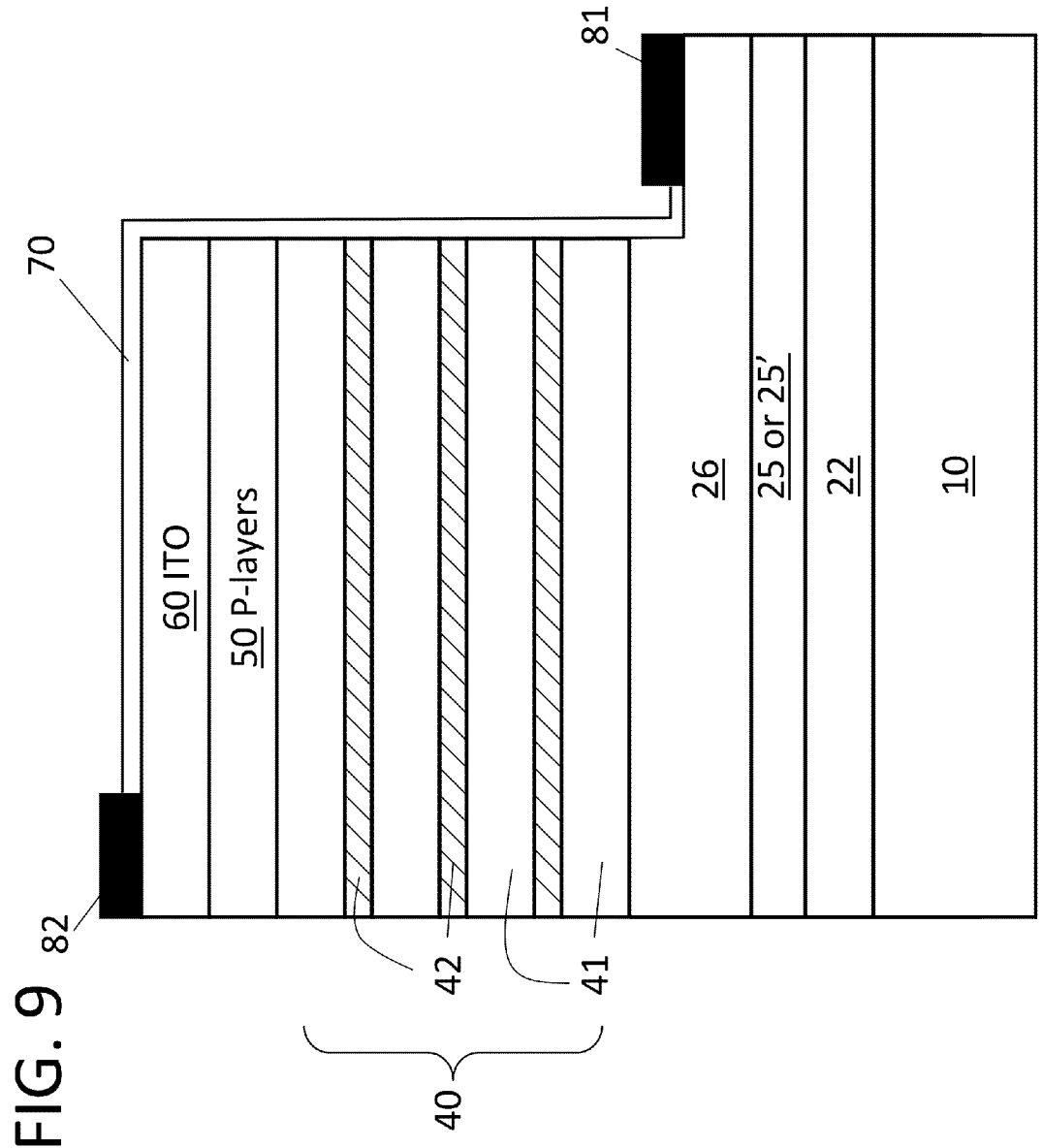

US 9,330,911 B2

LIGHT EMITTING DEVICE HAVING GROUP III-NITRIDE CURRENT SPREADING LAYER DOPED WITH TRANSITION METAL OR COMPRISING TRANSITION METAL NITRIDE

1. FIELD OF THE INVENTION

The present invention relates in general to light-emitting device having group III-nitride layer, more particularly to light-emitting device having group III-nitride layer doped with transition metal or comprising transition metal nitride and method for fabricating the same.

2. DESCRIPTION OF THE RELATED ART

III-nitride based light-emitting devices such as light-emitting diodes (LEDs) are widely acknowledged as the next generation light sources and are currently emerging as strong replacement of incandescent and fluorescent lamps in general lighting. For example, the field of interest uses Cerium-doped yttrium aluminum garnet (YAG:Ce) phosphor to convert InGaN multiple-quantum-well (MQW) LED's blue emission into white light, yielding commercial white light LEDs with luminous efficacies in the range of 80-110 lm/W. The R&D luminous efficacy record reported so far by Nichia has reached 183 lm/W (Y. Narukawa et al, J. Phys. D: Appl. Phys. 43, 354002 (2010).).

Further improvement in luminous efficacy requires lower device operation voltage, $V_f$. A straightforward method to reduce $V_f$ is to use heavily doped n-type and p-type layers in the LED structure, aiming at reducing series resistances of the LED. In the prior art, heavily Si-doped GaN, up to $2 \times 10^{19}$ cm$^{-3}$, has been employed in U.S. Pat. Nos. 6,630,692 and 7,026,653. It is noted that such a high Si-doping level, much higher than the Mott transition doping level ($\sim 2 \times 10^{18}$ cm$^{-3}$ for GaN), is detrimental, in one hand to the material quality hence the LED's IQE, on the other hand to the light extraction efficiency because of increased light absorption due to heavy doping.

When using Si as dopant for GaN, Si atoms substitute Ga atoms on the lattice sites providing free electrons for n-type conductivity. However, because of the local strain arising from the large difference between Si—N and Ga—N bonds, Si doping effectiveness tends to decrease when Si dopant concentration increases, with more and more Si atoms taking interstitial lattice positions. A commonly observed detrimental effect of Si-doping in GaN is that tensile strain builds up with Si doping level. Heavily doping with Si eventually results in nitride film cracks and crystal quality deterioration. Besides, the lowest resistivity of GaN achieved in the prior art using Si doping is still much higher than $1 \times 10^{-3}$ Ω·cm, usually higher than $5 \times 10^{-3}$ Ω·cm. This high resistivity limits current spreading and sets up a bottleneck for GaN based high-power LEDs.

3. SUMMARY OF THE INVENTION

To solve the problems discussed above, the present invention provides a light-emitting device, such as a light-emitting diode (LED), having a group III-nitride current spreading layer which is doped with transition metal. Throughout this specification the terms "III nitride" and "IIIA nitride" are exchangeably used. The inventor of the present invention discovers that using transition metal as dopants for group III nitrides has numerous advantages compared with traditional dopants such as silicon as will be discussed in more details later. According to the present invention transition metals are used as dopants for AlInGaN group IIIA nitrides such as GaN. These dopants include transition metals from groups IIIB-VIB of the periodic table of the elements, such as Scandium (Sc), Yttrium (Y), Titanium (Ti), Zirconium (Zr), Hafnium (Hf), Vanadium (V), Niobium (Nb), Tantalum (Ta), Chromium (Cr), Molybdenum (Mo), and Tungsten (W).

According to the present invention, the dopant concentration or equivalent dopant concentration of these transition metals in an AlInGaN nitride layer can be in the range of $10^{17}$-$10^{22}$ cm$^{-3}$. High dopant concentration is enabled in the present invention by reducing local lattice strain between the dopant and the host lattice.

The present invention also provides a light-emitting device, such as a light-emitting diode (LED), having a current spreading layer comprising alternating transition metal nitride layer and AlInGaN group III nitride layer such as GaN layer. The transition metal which can be used to form the transition metal nitride layer include transition metals from groups IIIB-VIB of the periodic table of the elements, such as Scandium (Sc), Yttrium (Y), Titanium (Ti), Zirconium (Zr), Hafnium (Hf), Vanadium (V), Niobium (Nb), Tantalum (Ta), Chromium (Cr), Molybdenum (Mo), and Tungsten (W).

The present invention also provides a light-emitting device, such as a light-emitting diode (LED), having a quantum well doped with transition metal from groups IIIB-VIB of the periodic table of the elements, such as Scandium (Sc), Yttrium (Y), Titanium (Ti), Zirconium (Zr), Hafnium (Hf), Vanadium (V), Niobium (Nb), Tantalum (Ta), Chromium (Cr), Molybdenum (Mo), and Tungsten (W).

In one aspect, the present invention provides a III-nitride light emitting device, which comprises:

an $Al_xIn_yGa_{1-x-y}N$ current spreading layer (where 0<=x<1, 0<=y<1, x+y<1) doped with one or more transition metal selected from the group consisting of Sc, Y, Ti, Zr, Hf, V, Nb, Ta, Cr, Mo, and W;

an n-type layer formed on the current spreading layer;

a p-type layer; and an active-region sandwiched between the n-type layer and the p-type layer.

Preferably, the $Al_xIn_yGa_{1-x-y}N$ current spreading layer is doped with one or more transition metal Hf, Zr, and Ti via introducing tetrakis dimethylamino hafnium, tetrakis dimethylamino titanium, and tetrakis dimethylamino zirconium.

Preferably, the $Al_xIn_yGa_{1-x-y}N$ current spreading layer is doped with the above transition metal with a dopant concentration in the range of $10^{17}$-$10^{22}$ cm$^{-3}$, for example, $10^{20}$-$10^{22}$ cm$^{-3}$.

Preferably, the $Al_xIn_yGa_{1-x-y}N$ current spreading layer has a composition: 0≤x≤0.8, 0≤y≤0.3.

Preferably, at least one quantum well in the active-region is doped with a transition metal selected from the group consisting of Sc, Y, Ti, Zr, Hf, V, Nb, Ta, Cr, Mo, and W.

Preferably, at least one quantum well in the active-region is doped with Hf, Zr, or Ti via introducing tetrakis dimethylamino hafnium, tetrakis dimethylamino titanium, and tetrakis dimethylamino zirconium.

Preferably, the at least one quantum well in the active-region is doped with a dopant concentration in the range of $10^{17}$-$10^{22}$ cm$^{-3}$, for example, $10^{18}$-$10^{20}$ cm$^{-3}$.

In another aspect, the present invention provides a III-nitride light emitting device, which comprises:

a current spreading layer comprising alternating $Al_xIn_yGa_{1-x-y}N$ layers and transition-metal nitride layers, where 0<=x<1, 0<=y<1, x+y<1;

an n-type layer formed on the current spreading layer;

a p-type layer; and an active-region sandwiched between the n-type layer and the p-type layer.

Preferably, a thickness of each of the $Al_xIn_yGa_{1-x-y}N$ layers and a thickness of each of the transition-metal nitride layers are selected to make the current spreading layer a conductive distributed Bragg reflector (DBR) with visible light reflectivity greater than 80%.

Preferably, the transition-metal nitride layers are made of HfN, ZrN, or TiN.

Preferably, the $Al_xIn_yGa_{1-x-y}N$ layer is made of GaN.

Preferably, at least one quantum well in the active-region is doped with a transition metal selected from the group consisting of Sc, Y, Ti, Zr, Hf, V, Nb, Ta, Cr, Mo, and W.

Preferably, at least one quantum well in the active-region is doped with Hf, Zr, or Ti via introducing tetrakis dimethylamino hafnium, tetrakis dimethylamino titanium, and tetrakis dimethylamino zirconium.

In another aspect, the present invention provides a III-nitride light emitting device, which comprises:

a current spreading layer comprising alternating $Al_xIn_yGa_{1-x-y}N$ layers and transition-metal nitride layers, or being an $Al_xIn_yGa_{1-x-y}N$ layer doped with transition metal selected from the group consisting of Sc, Y, Ti, Zr, Hf, V, Nb, Ta, Cr, Mo, and W, where $0<=x<1$, $0<=y<1$, $x+y<1$;

a p-type layer formed below the current spreading layer;

an n-type layer; and an active-region sandwiched between the n-type layer and the p-type layer.

Preferably, a thickness of each of the $Al_xIn_yGa_{1-x-y}N$ layers and a thickness of each of the transition-metal nitride layers are selected to make the current spreading layer a conductive distributed Bragg reflector (DBR) with visible light reflectivity greater than 80%.

Preferably, the transition-metal nitride layers are made of HfN, ZrN, or TiN.

Preferably, the $Al_xIn_yGa_{1-x-y}N$ layer is made of GaN.

Preferably, at least one quantum well in the active-region is doped with a transition metal selected from the group consisting of Sc, Y, Ti, Zr, Hf, V, Nb, Ta, Cr, Mo, and W.

Preferably, at least one quantum well in the active-region is doped with Hf, Zr, or Ti via introducing tetrakis dimethylamino hafnium, tetrakis dimethylamino titanium, and tetrakis dimethylamino zirconium.

In still another aspect, the present invention provides a III-nitride light emitting device, which comprises:

a substrate;

an n-type layer formed on the substrate;

a p-type layer; and an active-region sandwiched between the n-type layer and the p-type layer, wherein at least one quantum well in the active-region is doped with a transition metal selected from the group consisting of Sc, Y, Ti, Zr, Hf, V, Nb, Ta, Cr, Mo, and W.

Preferably, at least one quantum well in the active-region is doped with Hf, Zr, or Ti via introducing tetrakis dimethylamino hafnium, tetrakis dimethylamino titanium, and tetrakis dimethylamino zirconium.

Preferably, the at least one quantum well in the active-region is doped with a dopant concentration in the range of $10^{17}$-$10^{22}$ cm$^{-3}$, for example, $10^{18}$-$10^{20}$ cm$^{-3}$.

In still another aspect, the present invention provides a method of forming transition-metal-containing $Al_xIn_yGa_{1-x-y}N$ electrical conductive material, where $0<=x<1$, $0<=y<1$, $x+y<1$, which comprises:

providing ammonia as nitrogen source;

providing Al-, In-, and Ga-metalorganic source according to the formula $Al_xIn_yGa_{1-x-y}N$ and transition-metal metalorganic source simultaneously into a vapor phase epitaxy reactor for epitaxial growth of the transition-metal-containing $Al_xIn_yGa_{1-x-y}N$ electrical conductive material.

In still another aspect, the present invention provides a method of forming transition-metal-containing $Al_xIn_yGa_{1-x-y}N$ electrical conductive material, where $0<=x<1$, $0<=y<1$, $x+y<1$, which comprises:

providing ammonia as nitrogen source;

alternatively providing transition-metal metalorganic source and Al-, In-, Ga-metalorganic source according to the formula $Al_xIn_yGa_{1-x-y}N$ into a vapor phase epitaxy reactor for epitaxial growth of alternative transition-metal nitride layers and $Al_xIn_yGa_{1-x-y}N$ layers, which step comprising:

providing the Al-, In-, Ga-metalorganic source for a predetermined period of time without providing the transition metal source;

shutting off said Al-, In-, Ga-metalorganic source while providing the transition-metal metalorganic source for another predetermined period of time.

4. BRIEF DESCRIPTION OF THE DRAWINGS

The accompanying drawings, which are included to provide a further understanding of the invention and constitute a part of this application, illustrate embodiments of the invention and together with the description serve to explain the principle of the invention. Like reference numbers in the figures refer to like elements throughout, and a layer can refer to a group of layers associated with the same function.

FIG. 3 illustrates a III-nitride layer formed on a substrate with uniform doping of transition metal.

FIG. 3i illustrates the source flow logistics to realize a uniformly transition-metal doped III-nitride layer.

FIG. 9 illustrates the cross-sectional structure of an embodiment LED utilizing a transition-metal doped indium-containing multiple-quantum-well active-region.

5. DETAILED DESCRIPTION OF EMBODIMENTS

Figure 1:
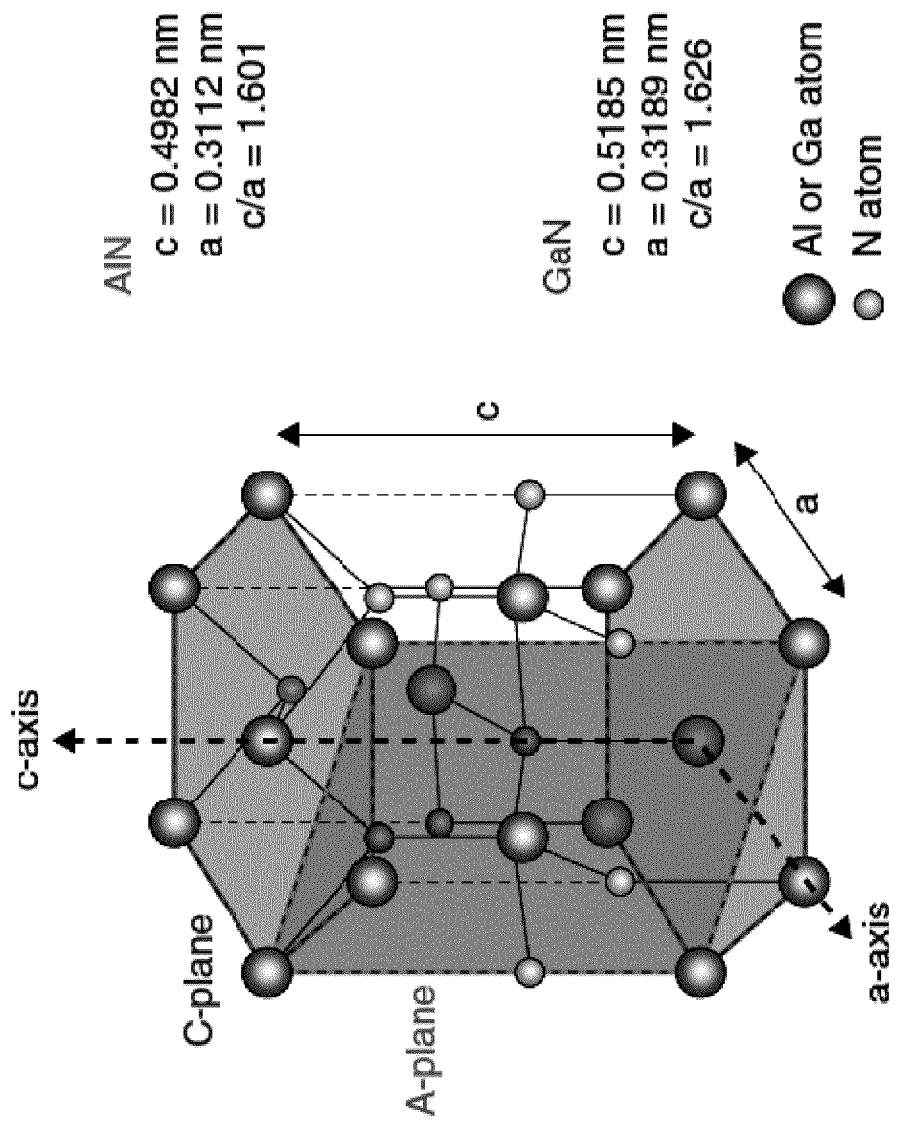
FIG. 1 illustrates a unit cell of III-nitride crystal.

FIG. 1 illustrates a unit cell for group IIIA-nitride with wurtzite crystal structure. As seen, the (0001) surface is metal atom-terminated. For wurtzite GaN, the (0001) surface is Ga-terminated. The in-plane lattice constant a for AlInGaN is from 3.111-3.544 Å, depending on Al-, In-, Ga-compositions.

Figure 2:
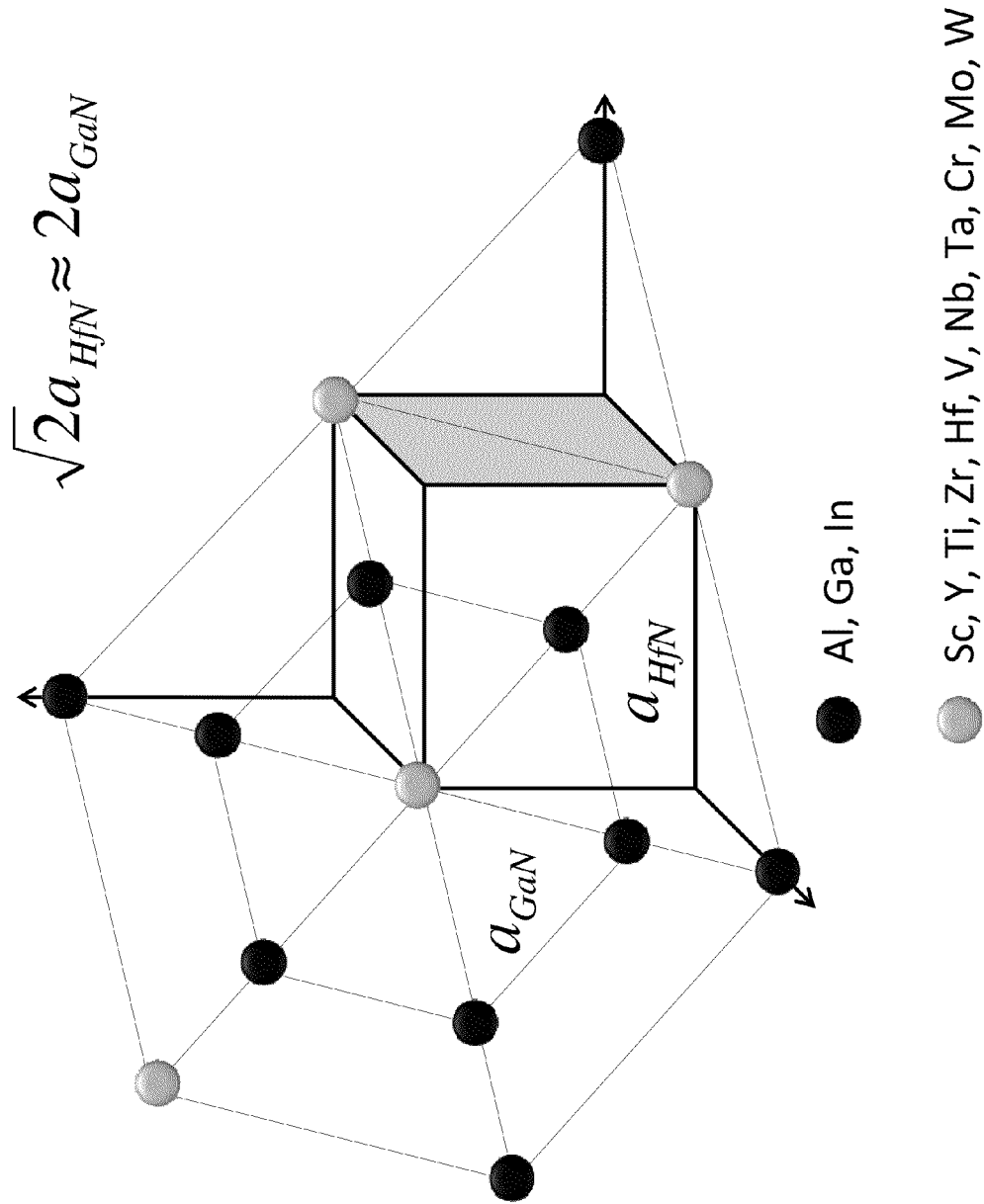
FIG. 2 illustrates the surface lattice structures of (0001) III-nitride and (111) transition-metal nitride.

Metallic nitrides including groups IIIB-VIB nitrides tend to take cubic lattice crystal structure (NaCl structure) with lattice constant around 4.5-4.6 Å. This means that cubic group IIIB-VIB nitrides and wurtzite group IIIA nitrides can mix together with small in-plane lattice mismatch when proper coincident-site lattice is arranged for (0001) wurtzite structure and (111) cubic structure. Referring to FIG. 2, taking cubic HfN and wurtzite GaN for example, when (111) HfN formed on (0001) GaN, coincident-site lattice involving two GaN unit cells and one HfN unit cell results in a very small in-plane lattice mismatch:

$$\frac{2a_{GaN} - \sqrt{2}\, a_{HfN}}{2a_{GaN}} = -0.21\%.$$

This means that high-quality (111) HfN can be grown on (0001) GaN, or high concentration of Hf atoms can be incorporated into (0001) GaN.

The present invention thus discloses new dopants for AlIn-GaN materials. The preferred dopants are listed in Table 1, including groups IIIB-VIB transition metals Sc, Y, Ti, Zr, Hf, V, Nb, Ta, Cr, Mo, and W.

TABLE 1

| Transition metal dopants in group IIIA-nitrides | | | |
|---|---|---|---|
| IIIB | IVB | VB | VIB |
| Sc | Ti | V | Cr |
| Scandium | Titanium | Vanadium | Chromium |
| Y | Zr | Nb | Mo |
| Yttrium | Zirconium | Niobium | Molybdenum |
|  | Hf | Ta | W |
|  | Hafnium | Tantalum | Tungsten |

These dopants can be incorporated into an AlInGaN layer without distinguishable boundaries, as shown in FIG. 3. The structure shown in FIG. 3 can be achieved via metalorganic chemical vapor deposition (MOCVD). Metalorganics of Sc, Y, Ti, Zr, Hf, V, Nb, Ta, Cr, Mo, and W can be used as dopant sources. For example, tetrakis diethylamido zirconium (Zr(N(C$_2$H$_5$)$_2$)$_4$, TDEAZ), tetrakis diethylamido titanium (Ti(N(C$_2$H$_5$)$_2$)$_4$, TDEAT) can be used as Zr and Ti dopant source. Similarly, tetrakis dimethylamino hafnium([Hf(N(CH$_3$)$_2$)$_4$]$_2$), tetrakis ethylmethylamino hafnium (Hf(N(C$_2$H$_5$CH$_3$))$_4$), and tetrakis diethylamino hafnium (Hf(N(C$_2$H$_5$)$_2$)$_4$) can be used as metalorganic sources of Hf. NH$_3$ is used as group V source, while Trimethylaluminium (TMA), Trimethylgallium (TMG), Trimethylindium (TMIn) are group IIIA sources. FIG. 3$i$ illustrates the source flow logistics to realize a uniformly transition-metal doped III-nitride layer 25 shown in FIG. 3. As seen, group V source NH$_3$, group IIIA MO sources TMG, TMA, and TMIn, and group IIIB-VIB MO sources are turned on simultaneously for a uniform doping of transition metal into layer 25 of AlInGaN. The current spreading layer 25 with any desired composition of Al$_x$In$_y$Ga$_{1-x-y}$N (where 0<=x<1, 0<=y<1, x+y<1) and desired transition metal dopant concentration (higher than 10$^{17}$ cm$^{-3}$, higher than 10$^{18}$ cm$^{-3}$, higher than 10$^{19}$ cm$^{-3}$, or higher than 10$^{20}$ cm$^{-3}$, for example 10$^{17}$-10$^{22}$ cm$^{-3}$) can be formed via MOCVD on substrate 10, which can be made of sapphire, silicon, silicon carbide, GaN, GaAs, AN and the like.

In an embodiment, a structure with a III-nitride current spreading layer doped with transition metal is fabricated as follows: a sapphire substrate 10 is loaded into an MOCVD reactor, and formed with an optional group III-nitride layer 22 thereon. For example, layer 22 can be made of GaN with a thickness in the range of 0.2-2 µm, for example 0.5-1 µm, and is formed via supplying of TMG and NH$_3$ into the MOCVD reactor. The purpose of layer 22 is to prepare a good growth surface for the following layers. Hf-doped current spreading layer 25 is formed over layer 22. Current spreading layer 25 can also be formed on substrate 10 directly without layer 22. Hf-dopant is supplied by a bubbler containing MO source of Hf. In an embodiment, this Hf MO source is tetrakis dimethylamino hafnium. By controlling the Hf MO bubbler's temperature, pressure, and carrier gas flow rate, a precise mass delivery control of Hf atoms into the MOCVD reactor is achieved. For example, the Hf MO bubbler's temperature can be controlled in the range of 0-60° C., for example 30-55° C., bubbler pressure in the range of 300-1500 torr, and H$_2$ or N$_2$ carrier gas flow rate in the range of 50-1000 sccm. For other transition metal dopants, similar conditions can be adopted. Layer 25 with any desired composition of Al$_x$In$_y$Ga$_{1-x-y}$N (where 0<=x<1, 0<=y<1, x+y<1) such as a GaN layer and desired dopant concentration (for example in the range of 10$^{17}$-10$^{22}$ cm$^{-3}$) can thus be achieved. The epitaxial growth of layer 25 can be carried out according to conventional method under conditions well known in the art while the doping is conducted by simultaneously introducing transition metal dopant. Layer 25 can be doped with single transition metal dopant or with multiple transition metal dopants corresponding to multiple doped layers within layer 25.

In an embodiment, layer 25 is a GaN layer having a thickness of 0.2-2 µm and doped with Hf with a dopant concentration about 10$^{18}$ cm$^{-3}$, 10$^{19}$ cm$^{-3}$, 10$^{20}$ cm$^{-3}$, 10$^{21}$ cm$^{-3}$, or 10$^{22}$ cm$^{-3}$, respectively.

In another embodiment, layer 25 is a GaN layer having a thickness of 0.2-3 µm and doped with Zr with a dopant concentration about 10$^{18}$ cm$^{-3}$, 10$^{19}$ cm$^{-3}$, 10$^{20}$ cm$^{-3}$, 10$^{21}$ cm$^{-3}$, or 10$^{22}$ cm$^{-3}$, respectively.

In another embodiment, layer 25 is a GaN layer having a thickness of 0.2-4 µm and doped with Ti with a dopant concentration about 10$^{18}$ cm$^{-3}$, 10$^{19}$ cm$^{-3}$, 10$^{20}$ cm$^{-3}$, 10$^{21}$ cm$^{-3}$, or 10$^{22}$ cm$^{-3}$, respectively.

Figure 4I:
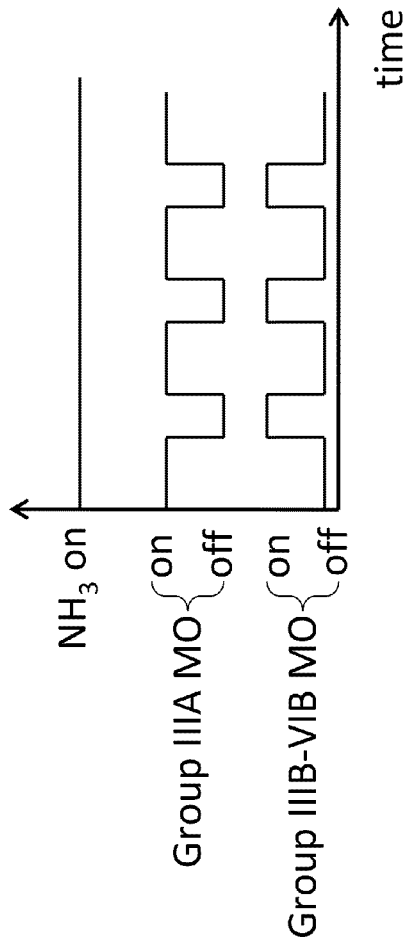
FIG. 4i illustrates the source flow logistics to realize III-nitride/transition-metal-nitride short period supperlattice.
Figure 4:
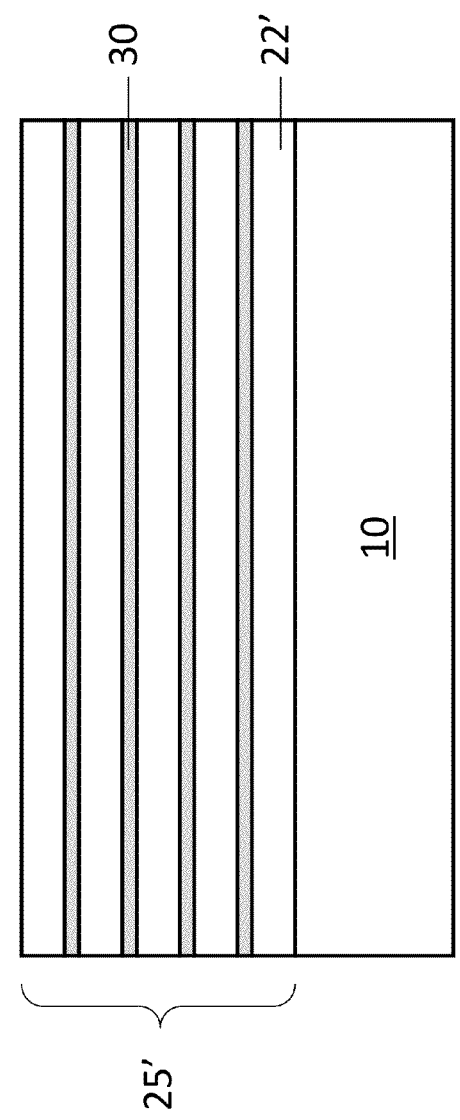
FIG. 4 illustrates a doping scheme of III-nitride/transition-metal-nitride short period supperlattice.

The doping can also be realized via multiple alternating thin layers of group IIIA nitride and group IIIB-VIB nitride, as shown in FIG. 4 and FIG. 4$i$. For the sake of convenience for description, this doping scheme is referred as superlattice (SL) doping in the following context. According to the present invention, this SL doping scheme for transition metals doping in group IIIA nitrides can significantly improve the conductivity of the current spreading layer. In FIG. 4, current spreading layer 25' comprises multiple alternating layers of layer 22' of Al$_x$In$_y$Ga$_{1-x-y}$N (where 0<=x<1, 0<=y<1, x+y<1), and transition metal nitride layer 30. There is no specific limit to the number of layer 30/layer 22' pairs. Usually, the number of layer 30/layer 22' pairs can be in the range of 5-50, such as 10-40, or 20-30. In some embodiments, layer 22' can be undoped GaN layer or Si-doped GaN layer, and layer 30 can be HfN, ZrN, or TiN layer. In current spreading layer 25', all layers 30 in the layer 30/layer 22 pairs can be made of the same transition metal nitride such as HfN, ZrN, or TiN, or different layer 30 can be made of different transition metal nitride such as HfN, ZrN, or TiN. In an embodiment, the thickness of layer 22' can be in the range from 5 nm to 100 nm, such as 10 nm to 80 nm, or 15 nm to 50 nm, the thickness of layer 30 can be in the range from 0.5 nm to 10 nm, such as from 1 nm to 5 nm.

In addition to the above superlattice doping scheme and the current spreading layer structure obtained there from, in other embodiments, the thicknesses of layer 22' and layer 30 can also be arranged to make layer 25' a conductive distributed Bragg reflector (DBR) with visible light reflectivity greater than 80%, preferably greater than 90%, more preferably greater than 95%. The thickness of layer 22' and layer 30 used in the DBR embodiments can be determined as described below and usually can be in the range from 40-100 nm and 50-350 nm, respectively. The requirements of forming a distributed Bragg reflector (DBR) are known in the art. For example, it is described in U.S. Pat. No. 5,226,053, which is hereby incorporated by reference in its entirety. In order to form a distributed Bragg reflector (DBR) structure, layer 25' can be composed of 10 to 40 pairs of layer 30/layer 22', the thickness of each layer 30 and layer 22' in the pair equals $\lambda/4n$, where $\lambda$ is the optical spontaneous emission wavelength of the active region of the LED and n is the refractive index of the semiconductor material of layer 30 and layer 22'. For a device with an active region spontaneously emitting at $\lambda$-450 nm, a layer 25' of layer 22'/layer 30 pairs of such semiconductors as GaN and HfN with refractive indices of 2.46 and 0.56, respectively, will consist of 46 nm thick GaN layer and 200 nm thick HfN layer. For GaN/ZrN and GaN/TiN pairs, the thickness of GaN/ZrN and GaN/TiN layer pair can be 46/225 nm and 46/75 nm, respectively. In some embodiments, the thickness of layer 30 or layer 22' does not have to equal $\lambda/4n$ so as to form an ideal DBR structure, instead the thickness of layer 30 or layer 22' can be in the range of $0.8\lambda/4n$ to $1.2\lambda/4n$, or $0.9\lambda/4n$ to $1.1\lambda/4n$ so as to form a non-ideal DBR structure. Generally, the visible light reflectivity of DBR structure can be made greater than 80%, 90%, or 95% by adjusting the thickness of layer 30 and layer 22'.

In the superlattice doping scheme, in some embodiments, layer 30 can be of thickness less than 5 nm, or less than 2 nm, for example about 0.4 or 0.5 or 0.6 nm, being equivalent to delta doping of transition metals in layer 22'. Delta doping technique is understood by those skilled in the art, meaning doping with very high-concentration dopant, i.e., greater than $5 \times 10^{19}$ cm$^{-3}$, or, in the range of $10^{20}$ cm$^{-3}$-$10^{22}$ cm$^{-3}$, within a very narrow thickness of host material, for example, within 5-20 Å. As layer 30 is a very thin layer, it may or may not be a continuous layer, it may cover the entire surface of the underneath layer 22', or it may expose portions of the surface of the underneath layer 22' especially when it has a very thin thickness in the range of 0.4-1.5 nm.

Layer 25' can be realized via the source flow logistics illustrated in FIG. 4i, wherein MO sources of group IIIA, and group IIIB-VIB are alternatively turned on and off while group V source NH$_3$ kept on.

Layer 25 and layer 25' shown in FIG. 3 and FIG. 4 possess improved n-type conductivity compared with that of the current spreading layer used in the prior art.

Some experimental results are shown in the following content regarding to transition-metal-doped IIIA-nitrides (i.e., layer 25 or layer 25'), especially for HfN doping in GaN.

In one embodiment, layer 25 was made of a 3 μm-thick GaN layer uniformly doped with Hf, formed over layer 22 made of a 1.5 μm-thick unintentionally-doped (UID) GaN layer, which was formed over substrate 10 of a (0001)-orientated sapphire substrate. The formation of this layer 25 was performed under hydrogen (H$_2$) atmosphere, with simultaneous introduction of Ga and Hf metalorganic sources and nitrogen source ammonia (NH$_3$) into an MOCVD chamber. The Ga source was TMG and Hf source was tetrakis dimethylamino hafnium ([Hf(N(CH$_3$)$_2$)$_4$]$_2$, HFMDA). The doping level was $5 \times 10^{18}$ cm$^{-3}$, estimated from the molar flow ratio of HFMDA and TMG sources. The layer formation temperature and pressure were 1060° C. and 360 mbar, respectively. The molar flow rates of HFMDA and TMG were 0.028 and 226 μmole/min, respectively, which translated into a Hf doping level of $5.0 \times 10^{18}$ cm$^{-3}$.

In another embodiment, The molar flow rates of HFMDA and TMG were 6.296 and 226 μmole/min, respectively, which translated into a Hf doping level of $1.1 \times 10^{21}$ cm$^{-3}$.

The electrical properties of these two embodiments as measured by Hall Effect measurement are listed in table 2, together with those of a reference sample made of UID GaN.

TABLE 2

Hall Effect measurement data on GaN:Hf and UID GaN samples

| Sample # | | K110819A GaN:Hf [Hf] = 1.1e21 | K110721A GaN:Hf [Hf] = 5e18 | K110720A (UID GaN) |
|---|---|---|---|---|
| T Hall Effect Data | N (cm$^{-3}$) | $1.33 \times 10^{19}$ | $2.8 \times 10^{16}$ | $8.46 \times 10^{16}$ |
| | μ (cm$^2$/V·s) | 172 | 100 | 199 |
| | ρ (Ω·cm) | $2.76 \times 10^{-3}$ | 2.23 | 0.37 |
| Estimated activation energy @ RT (meV) | | 115 | 132.5 | |

As seen from table 2, when Hf doping level was $5.0 \times 10^{18}$ cm$^{-3}$, the obtained electron concentration was $2.8 \times 10^{16}$ cm$^{-3}$, with a donor activation energy of 132.5 meV at room-temperature (RT). When Hf doping level was $1.1 \times 10^{21}$ cm$^{-3}$, the obtained electron concentration was $1.33 \times 10^{19}$ cm$^{-3}$, with a donor activation energy of 115 meV at room-temperature (RT). It is thus discovered by the present inventors that Hf is a donor in GaN, providing free electrons for electrical conductance. The activation energy was calculated by the equation:

$$n = N_d e^{-\frac{E_a}{kT}},$$

wherein n and N$_d$ are respectively the electron and donor concentrations, E$_a$ the donor activation energy.

Table 2 revealed that by doping of Hf into GaN, electron concentration as high as $1.33 \times 10^{19}$ cm$^{-3}$ and electrical resistivity as low as $2.76 \times 10^{-3}$ Ω·cm were achieved. It is noted that this resistivity is much lower than that of the conventional heavily Si-doped GaN (usually $\geq 5 \times 10^{-3}$ Ω·cm).

Even though Hf is a deeper donor than Si in GaN, as evidenced from the larger donor activation energy of 115 meV in contrast to ~28 meV for Si in GaN, high concentration electrons are provided by Hf doping in GaN, with good mobility. This means Hf-doping of GaN can result in very low electrical resistivity. As previously explained with reference to FIG. 2, (111) transition-metal nitrides possess small lattice mismatch to (0001) GaN, high-concentration transition metal atoms can be incorporated into GaN lattice without overly distorting the hosting lattice. The doping level in GaN for Hf, and other transition metals listed in table 1 therefore can be as high as $10^{21}$ cm$^{-3}$, or higher than $10^{22}$ cm$^{-3}$, or higher than $3 \times 10^{22}$ cm$^{-3}$, to provide electron concentrations as high as $10^{19}$ cm$^{-3}$, or higher than $10^{20}$ cm$^{-3}$, or higher than $3 \times 10^{20}$ cm$^{-3}$.

On the contrary, since silicon nitride possesses very large lattice mismatch to GaN, the doping level of Si in GaN is limited to $10^{19}$ cm$^{-3}$. Higher doping will introduce lattice distortion and defects, resulting in less electrons. This is to say, using Si donors for GaN, the achievable electron concentration is limited to $10^{19}$ cm$^{-3}$, whereas using transition metal donors, the achievable electrons can be more than $10^{20}$ cm$^{-3}$.

Some experimental results are shown in the following content regarding to SL doping scheme of transition metals in GaN, especially for HfN doping in GaN.

In one embodiment, layer 25' consists of 10 pairs of GaN layer 22'/HfN layer 30 with respective thickness of 250 Å/5.3 Å. These thicknesses were estimated from growth rate and growth time and can be regarded as nominal thicknesses. Growth rate is determined by depositing a rather thick layer for a long period of time. The 5.3 Å-thick HfN-layer insertion into GaN is equivalent to Hf delta-doping in GaN, as explained previously in this specification. The formation of this layer 25' was performed under ammonia (NH$_3$) and hydrogen (H$_2$) atmosphere. HfN thin film formation was achieved via simultaneously introduction of Hf MO source tetrakis dimethylamino hafnium ([Hf(N(CH$_3$)$_2$)$_4$]$_2$, HFMDA) and nitrogen source NH$_3$ into an MOCVD chamber. GaN thin film was formed by TMG and NH$_3$. The formation temperature and pressure for both kinds of thin films were kept same at 1060° C. and 360 mbar, respectively. The flow rates of HFMDA and TMG were 2.39 and 226 μmole/min, respectively. The electrical properties of this 10-pair HfN/GaN SL structure are listed in table 3, together with those of a reference sample made of unintentionally doped (UID) GaN.

TABLE 3

Hall Effect measurement data on HfN/GaN SL structure and UID GaN

| Sample # | K110722A<br>10 × (5.3 Å/250 Å)<br>HfN/GaN SL | K110720A<br>(UID Reference) |
|---|---|---|
| RT Hall Effect Data | N (cm$^{-3}$) | 5.52 × 10$^{18}$ | 8.46 × 10$^{16}$ |
| | μ (cm$^2$/V · s) | 147 | 199 |
| | ρ (Ω · cm) | 8.1 × 10$^{-3}$ | 0.37 |

As evidenced from Table 3, via inserting thin-film HfN between GaN layers, greatly enhanced electric conductance was realized. The Hall effect measurements revealed that an electron concentration of 5.52×10$^{18}$ cm$^{-3}$ and a resistivity of 8.1×10$^{-3}$ Ω·cm were achieved, in contrast to the corresponding values of 8.46×10$^{16}$ cm$^{-3}$ and 0.37 Ω·cm from a UID GaN reference sample.

Figure 5A:
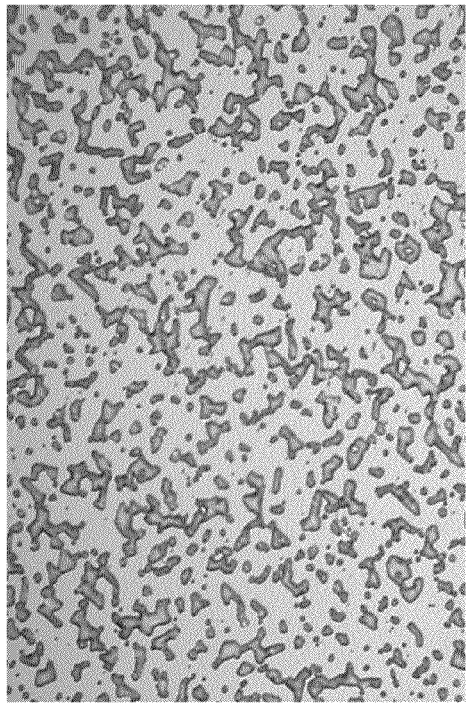
FIG. 5A is the 500× magnification optical microscopic surface image of a HfN/GaN superlattice structure grown under hydrogen and ammonia ambient according to an embodiment of the present invention.
Figure 5B:
FIG. 5B is the 500× magnification optical microscopic surface image of a reference UID GaN structure grown under hydrogen and ammonia ambient.

FIG. 5A and FIG. 5B respectively show the optical surface morphology of the above HfN/GaN SL sample and the UID GaN reference sample (with magnification 500×). Compared to the smooth feature of the UID GaN reference sample, the HfN/GaN SL sample possessed rough surface, featuring uncoalescent GaN networks. Upon thick GaN growth on top of the networks the surface roughness can be easily smoothened out via enhanced lateral growth rate of GaN. This rough-smooth transition growth can greatly improve GaN material quality since during the smoothening growth process, threading dislocations can be bended and annihilated. The present invention thus reveals that high-quality GaN films can be achieved via HfN thin film insertion.

Figure 6A:
FIG. 6A is the 500× magnification optical microscopic surface image of a HfN/GaN superlattice structure grown under nitrogen and ammonia ambient according to an embodiment of the present invention.
Figure 6B:
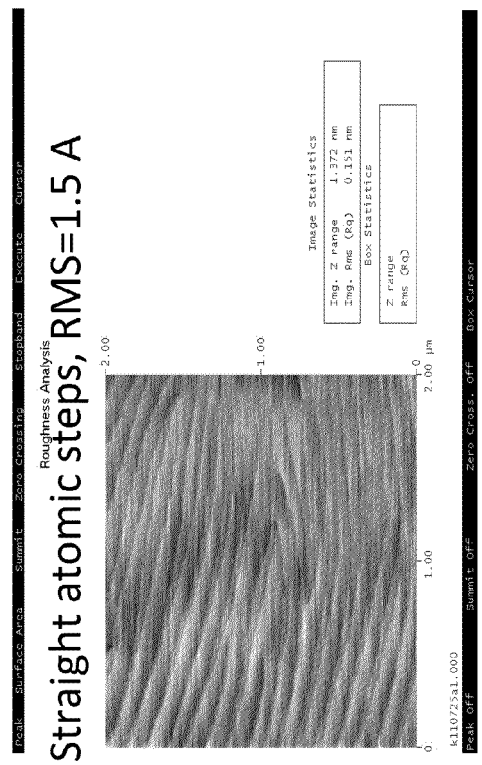
FIG. 6B is a 2 μm×2 μm atomic force microscopic scan of the surface of a HfN/GaN superlattice structure grown under nitrogen and ammonia ambient according to an embodiment of the present invention.

The surface roughness of the HfN/GaN SL sample was founded by the present inventors to be H$_2$ and NH$_3$ sensitive, especially H$_2$ sensitive. When growing the same 10-pair SL structure of 5.3 Å/250 Å HfN/GaN under N$_2$ and NH$_3$ atmosphere, the surface of the SL sample turned out to be very smooth, as evidenced by FIG. 6A, which is the 500× magnification optical microscopic image of the sample surface, and by FIG. 6B, which is the atomic force microscopic (AFM) scan of the sample surface. Clear atomic steps were observed from the AFM image of FIG. 6B, which measured a root-mean-square (RMS) roughness as small as 1.5 Å, indicating superior surface morphology of the HfN/GaN SL grown under nitrogen ambient.

The electrical conductivity of the nitrogen ambient HfN/GaN SL structure was also greatly improved, as compared to that of the sample grown under hydrogen ambient. The Hall measurement data are listed in Table 4 for comparison. As seen, electron density as high as 1.08×10$^{19}$ cm$^{-3}$ and resistivity as low as 3.97×10$^{-3}$ Ω·cm were achieved. It is noted that this resistivity is already much lower than that of the conventional heavily Si-doped GaN (≥5×10$^{-3}$ Ω·cm). By increasing HfN thickness in the SL structure, the resistivity are expected to be reduced further, yet without introducing or suffering from extra absorption to visible light. Resistivity lower than 10$^{-4}$ Ω·cm has been obtained with inserting HfN layers with thickness greater than 20 Å. Growth temperature of the HfN/GaN SL structure also plays an important role in the surface morphology. By reducing the growth temperature from 1060° C. to 950° C., the surface pits shown in FIG. 6A were eliminated, with improved electrical conductivity of the HfN/GaN SL structure.

TABLE 4

Hall Effect measurement data of
HfN/GaN SL grown under N$_2$ and H$_2$ ambient

| Sample # | | K110725A<br>HfN/GaN SL:N$_2$<br>ambient | K110722A<br>HfN/GaN SL:<br>H$_2$ ambient |
|---|---|---|---|
| RT Hall Effect Data | N (cm$^{-3}$) | 1.08 × 10$^{19}$ | 5.52 × 10$^{18}$ |
| | μ (cm$^2$/V · s) | 150 | 147 |
| | ρ (Ω · cm) | 3.97 × 10$^{-3}$ | 8.1 × 10$^{-3}$ |

It is thus concluded here that HfN/GaN SL doping scheme in group-IIIA nitrides can significantly improve the electrical properties of a current spreading layer. When the doping is performed under pure nitrogen ambient or nitrogen and ammonia ambient, better results are achieved than the doping is performed under hydrogen and ammonia ambient. The thicknesses of HfN and GaN in the SL structure can be from 1-50 Å, and from 50-500 Å, respectively, for the best compromise between electrical conductivity and optical transparency. The SL formation temperature is preferred to be from 500-1100° C., and the SL structure can be realized by MOCVD, or MBE (molecular beam epitaxy), or HVPE (hydride vapor phase epitaxy).

Because of the superior conductivity of layer 25', device structures formed over layer 25' can have superior current spreading capability, enabling large area horizontal device fabrication without or with reduced current crowding effect near electrodes, with better utilization of light-emitting area.

Figure 7:
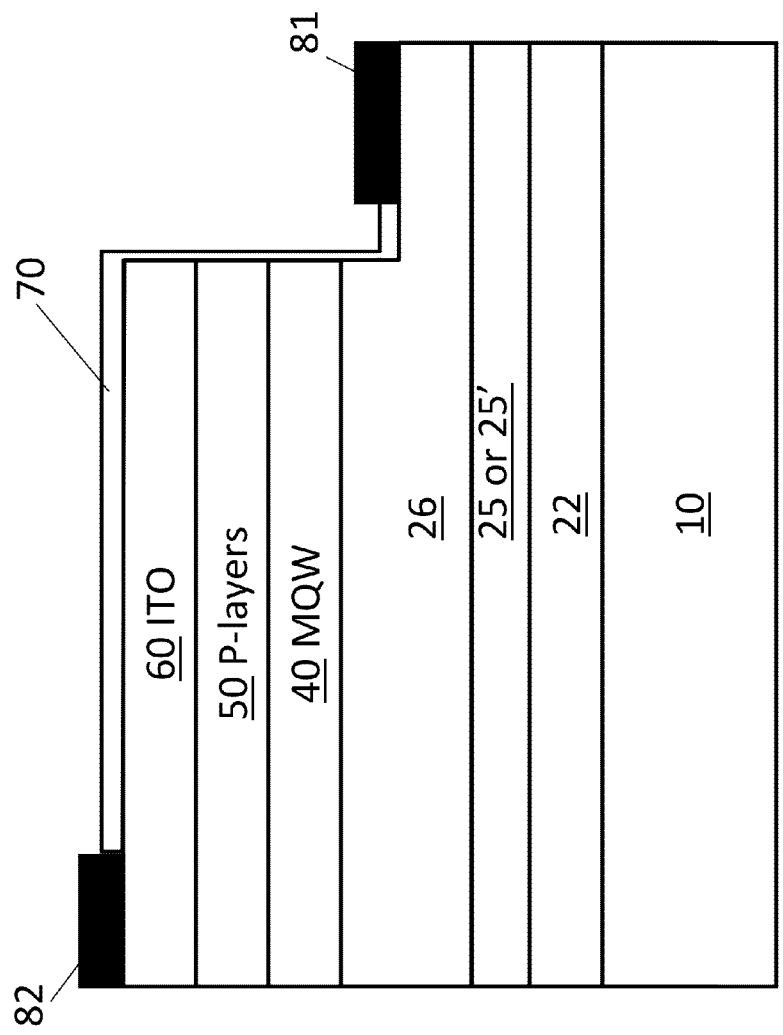
FIG. 7 illustrates the cross-sectional structure of an embodiment LED utilizing a transition-metal doped group IIIA-nitride film as n-type current spreading layer.

Shown in FIG. 7 is the cross-sectional schematic view of an LED embodiment of the present invention. Substrate 10 can be Si, SiC, GaAs, sapphire or any other suitable substrate, with or without a template layer of group III-nitride. For example, substrate 10 can be patterned sapphire substrate. Formed over substrate or template 10 is an optional undoped or intrinsic GaN layer 22, followed by a transition-metal doped layer 25 for current spreading. Above layer 25, a conventional LED structure comprising n-type layer 26, active-region 40, p-type layer 50 and ITO layer 60 can be formed in sequence by known methods. N-type layer 26 can be made of Si-doped GaN, or InGaN, or AlGaN, with average In or Al composition less than 10%, for example 3%-7%, for visible LEDs, respectively. Active-region 40 can be made of GaN/

InGaN multiple-quantum-well, and p-type layer 50 can be Mg-doped p-GaN, p-AlGaN, and p-InGaN. ITO layer 60, usually of thickness of 200-400 nm, is used to spreading current for p-layers. In the above structure, the transition-metal doped layer 25 can be replaced by layer 25' which comprises multiple alternating layers of AlInGaN layer 22 and transition metal nitride layer 30.

Then standard lithographic and etching process is performed to form device mesas for p-contact pad 82 and n-contact pad 81, and mesa edges are protected with a passivation layer 70, preferably made of silicon nitride or silicon dioxide.

Even though not shown, it is easily to be understood by those skilled in the art that a vertical LED structure containing layer 25 or layer 25' of the present invention can be fabricated using known device fabrication methods.

Figure 8:
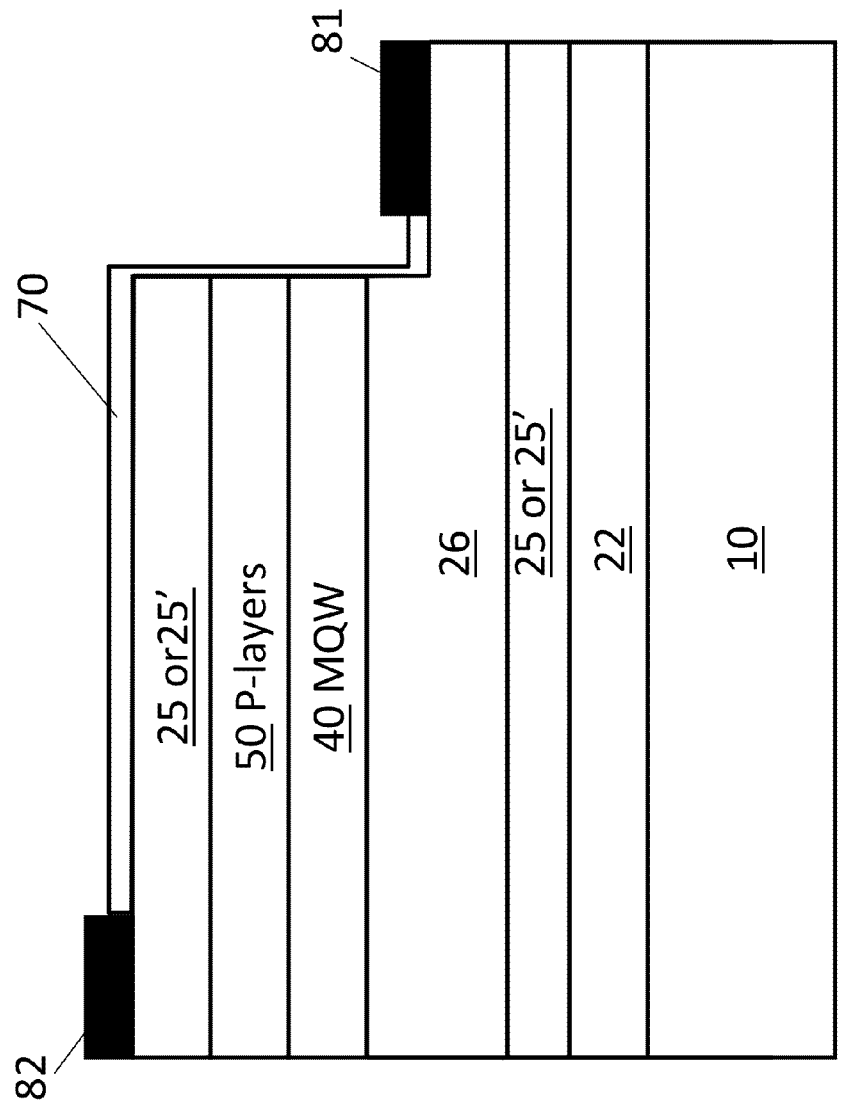
FIG. 8 illustrates the cross-sectional structure of an embodiment LED utilizing a transition-metal doped group IIIA-nitride film as p-type current spreading layer.

In another embodiment, layer 25 or 25' as shown and discussed in connection with FIGS. 3 and 4 can also be used as p-type current spreading layer, replacing the conventional ITO layer, as shown in FIG. 8. In this embodiment, layer 25' is preferred to have resistivity less than $1 \times 10^{-3}$ $\Omega \cdot cm$, more preferably less than $1 \times 10^{-4}$ $\Omega \cdot cm$, with thickness in the range of 50-5000 nm. Layer 25' is preferred to have rough surface feature as shown in FIG. 5A, for better current spreading and light extraction. In another embodiment of the present invention, transition-metal doped indium-containing layer can be used as LED active-layer. As shown in FIG. 9, MQW 40 comprising one or more quantum barriers (QB) 41 and one or more quantum wells (QW) 42 constitutes the active-layer, wherein according to the present invention, QW 42 is made of transition-metal doped indium-containing III-nitride. The dopant for QW 42 can be selected from the transition metal listed in Table 1. The MO source used for transition-metal dopant in QW 42 is preferably to be tetrakis dimethylamino hafnium, tetrakis dimethylamino titanium, tetrakis dimethylamino zirconium et al. It is believed that these dopants can modify the conductivity of QW 42. Besides, the active nitrogen in the radicals of tetrakis dimethylamino can enhance indium incorporation and improve the structure quality of QW 42. The transition-metal doped QW 42 can be grown by conventional method known in the art while simultaneously introducing transition metal dopant. Optionally, one, or more, or all of the quantum wells 42 can be doped with transition metal. The growth of quantum well 42 and the doping of transition metal into quantum well 42 can be conducted according to conventional method. For example, the growth of quantum well 42 and the doping of transition metal therein can be carried out in an MOCVD reactor at a temperature in the range of 600-850° C. and pressure in the range of 50-760 torr. The transition metal dopant concentration in quantum well 42 can be higher than $10^{16}$ $cm^{-3}$, or $10^{17}$ $cm^{-3}$, for example in the range of $10^{16}$-$10^{22}$ $cm^{-3}$. or $10^{18}$-$10^{20}$ $cm^{-3}$ In an embodiment, quantum well 42 is doped with Hf with a dopant concentration about $10^{16}$ $cm^{-3}$, $10^{17}$ $cm^{-3}$, $10^{18}$ $cm^{-3}$, $10^{19}$ $cm^{-3}$, $10^{20}$ $cm^{-3}$, $10^{21}$ $cm^{-3}$, and $10^{22}$ $cm^{-3}$, respectively.

In another embodiment, quantum well 42 is doped with Zr with a dopant concentration about $10^{16}$ $cm^{-3}$, $10^{17}$ $cm^{-3}$, $10^{18}$ $cm^{-3}$, $10^{19}$ $cm^{-3}$, $10^{20}$ $cm^{-3}$, $10^{21}$ $cm^{-3}$, and $10^{22}$ $cm^{-3}$, respectively.

In another embodiment, quantum well 42 is doped with Ti with a dopant concentration about $10^{16}$ $cm^{-3}$, $10^{17}$ $cm^{-3}$, $10^{18}$ $cm^{-3}$, $10^{19}$ $cm^{-3}$, $10^{20}$ $cm^{-3}$, $10^{21}$ $cm^{-3}$, and $10^{22}$ $cm^{-3}$, respectively.

In the structure shown in FIG. 9, the other layers can be identical with that of the structure shown in FIG. 7 except for multiple quantum well 40. In another embodiment, the current spreading layer 25 or 25' and layer 22 in the structure shown in FIG. 9 can be omitted.

In the LED embodiments shown in FIG. 7 and FIG. 9, layer 25 (25') is placed further away from the active region MQW 40 as compared to the n-type layer 26, in other embodiments, layer 25 (25') can be placed closer to the active-region MQW 40 as compared to layer 26. In other words, layer 25(25') can be placed in direct contact with the active-region MQW 40.

The present invention has been described using exemplary embodiments. However, it is to be understood that the scope of the present invention is not limited to the disclosed embodiments. On the contrary, it is intended to cover various modifications and similar arrangement or equivalents. The scope of the claims, therefore, should be accorded the broadest interpretation so as to encompass all such modifications and similar arrangements and equivalents.

What is claimed is:

1. A III-nitride light emitting device, comprising
   a current spreading layer comprising alternating $Al_xIn_yGa_{1-x-y}N$ layers and transition-metal nitride layers made of IIIB-VIB nitride, where $0<=x<1$, $0<=y<1$, $x+y<1$;
   an n-type layer formed on the current spreading layer;
   a p-type layer; and
   an active-region sandwiched between the n-type layer and the p-type layer
   wherein an outmost surface of the current spreading layer facing the n-type layer is a rough surface with uncoalescent $Al_xIn_yGa_{1-x-y}N$ networks.

2. The III-nitride light emitting device of claim 1, wherein a thickness of each of the $Al_xIn_yGa_{1-x-y}N$ layers is in the range of 5-100 nm and a thickness of each of the transition-metal nitride layers is in the range of 0.4-10 nm.

3. The III-nitride light emitting device of claim 1, wherein a thickness of each of the $Al_xIn_yGa_{1-x-y}N$ layers and a thickness of each of the transition-metal nitride layers are selected to make the current spreading layer a conductive distributed Bragg reflector (DBR) with visible light reflectivity greater than 80%.

4. The III-nitride light emitting device of claim 1, wherein the transition-metal nitride layers are made of HfN, ZrN, or TiN.

5. The III-nitride light emitting device of claim 1, wherein the $Al_xIn_yGa_{1-x-y}N$ layers are made of GaN.

6. The III-nitride light emitting device of claim 1, wherein at least one quantum well in the active-region is doped with a transition metal selected from the group consisting of Sc, Y, Ti, Zr, Hf, V, Nb, Ta, Cr, Mo, and W.

7. The III-nitride light emitting device of claim 6, wherein said at least one quantum well in the active-region is doped with Hf, Zr, or Ti via introducing tetrakis dimethylamino hafnium, tetrakis dimethylamino titanium, and tetrakis dimethylamino zirconium.

8. The III-nitride light emitting device of claim 2, wherein the thickness of each of the transition-metal nitride layers is in the range of 0.4-2 nm.

9. The III-nitride light emitting device of claim 8, wherein at least one of the transition-metal nitride layers is not a continuous layer.

10. The III-nitride light emitting device of claim 4, wherein the transition-metal nitride layers are made of HfN or ZrN.

11. The III-nitride light emitting device of claim 1, wherein a thickness of each of the $Al_xIn_yGa_{1-x-y}N$ layers is larger than a thickness of each of the transition-metal nitride layers.

12. A III-nitride light emitting device, comprising
    a current spreading layer comprising alternating $Al_xIn_yGa_{1-x-y}N$ layers and transition-metal nitride layers made of IIIB-VIB nitride, where $0<=x<1$, $0<=y<1$, $x+y<1$, wherein a thickness of each of the $Al_xIn_yGa_{1-x-y}N$ layers is larger than a thickness of each of the transition-metal nitride layers;

an n-type layer formed on the current spreading layer;

a p-type layer; and an active-region sandwiched between the n-type layer and the p-type layer.

13. The III-nitride light emitting device of claim 12, wherein a thickness of each of the $Al_xIn_yGa_{1-x-y}N$ layers is in the range of 5-100 nm and a thickness of each of the transition-metal nitride layers is in the range of 0.4-10 nm.

14. The III-nitride light emitting device of claim 13, wherein the thickness of each of the transition-metal nitride layers is in the range of 0.4-2 nm.

15. The III-nitride light emitting device of claim 13, wherein at least one of the transition-metal nitride layers is not a continuous layer.

16. The III-nitride light emitting device of claim 12, wherein a thickness of each of the $Al_xIn_yGa_{1-x-y}N$ layers and a thickness of each of the transition-metal nitride layers are selected to make the current spreading layer a conductive distributed Bragg reflector (DBR) with visible light reflectivity greater than 80%.

17. The III-nitride light emitting device of claim 12, wherein the transition-metal nitride layers are made of HfN, ZrN, or TiN.

18. The III-nitride light emitting device of claim 17, wherein the transition-metal nitride layers are made of HfN or ZrN.

19. The III-nitride light emitting device of claim 12, wherein the $Al_xIn_yGa_{1-x-y}N$ layers are made of GaN.

20. The III-nitride light emitting device of claim 12, wherein at least one quantum well in the active-region is doped with a transition metal selected from the group consisting of Sc, Y, Ti, Zr, Hf, V, Nb, Ta, Cr, Mo, and W.

21. The III-nitride light emitting device of claim 20, wherein said at least one quantum well in the active-region is doped with Hf, Zr, or Ti via introducing tetrakis dimethylamino hafnium, tetrakis dimethylamino titanium, and tetrakis dimethylamino zirconium.

* * * * *